US012772386B2

(12) United States Patent
Lee et al.

(10) Patent No.: US 12,772,386 B2
(45) Date of Patent: Oct. 20, 2026

(54) CIRCUIT BOARD ASSEMBLY MANUFACTURING METHOD, CIRCUIT BOARD ASSEMBLY MANUFACTURED BY SAME, AND ELECTRIC VEHICLE INCLUDING SAME

(71) Applicant: LG ENERGY SOLUTION, LTD., Seoul (KR)

(72) Inventors: Bum Jick Lee, Daejeon (KR); Young Su Son, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 1069 days.

(21) Appl. No.: 17/800,775

(22) PCT Filed: Jun. 15, 2021

(86) PCT No.: PCT/KR2021/007515
§ 371 (c)(1),
(2) Date: Aug. 18, 2022

(87) PCT Pub. No.: WO2021/261832
PCT Pub. Date: Dec. 30, 2021

(65) Prior Publication Data
US 2023/0094525 A1 Mar. 30, 2023

(30) Foreign Application Priority Data
Jun. 23, 2020 (KR) ........................ 10-2020-0076507
Apr. 9, 2021 (KR) ........................ 10-2021-0046550

(51) Int. Cl.
*H05K 3/28* (2006.01)
*B60L 58/10* (2019.01)

(52) U.S. Cl.
CPC .............. *H05K 3/284* (2013.01); *B60L 58/10* (2019.02)

(58) Field of Classification Search
CPC ...................................................... H05K 3/284
(Continued)

(56) References Cited

U.S. PATENT DOCUMENTS 5,360,329 A * 11/1994 Lemelson ........... B29C 37/0032 264/328.14
6,377,465 B1 4/2002 Tanaka
(Continued)

FOREIGN PATENT DOCUMENTS

EP 1895583 A1 * 3/2008 ............. H05K 3/284
JP 2000-218629 A 8/2000
(Continued)

OTHER PUBLICATIONS

International Search Report (PCT/ISA/210) issued in PCT/KR2021/007515, dated Sep. 17, 2021.
(Continued)

*Primary Examiner* — Eric D Lee
(74) *Attorney, Agent, or Firm* — Birch, Stewart, Kolasch & Birch, LLP

(57) ABSTRACT

The present invention relates to a method for manufacturing a circuit board assembly, which includes: mounting a plurality of components on a circuit board; preparing a mold comprising a concave portion corresponding to a shape of each of the plurality of components and a convex portion corresponding to a surface of the circuit board; providing the mold at an upper side of the circuit board and preparing a protective material to be disposed on the circuit board; disposing the protective material on the circuit board and the components by using the mold; and curing the protective material to form a protective layer.

17 Claims, 6 Drawing Sheets

(58) Field of Classification Search
USPC .......................................................... 716/54
See application file for complete search history.

(56) References Cited

U.S. PATENT DOCUMENTS

| | | | |
|---|---|---|---|
| 9,254,588 | B1 | 2/2016 | Chao et al. |
| 10,631,413 | B1 | 4/2020 | Chao et al. |
| 2005/0188814 | A1 | 9/2005 | Yoon |
| 2013/0077265 | A1 | 3/2013 | Lee et al. |
| 2016/0056091 | A1 | 2/2016 | Kim et al. |
| 2017/0367192 | A1 | 12/2017 | Lee |
| 2019/0081362 | A1* | 3/2019 | Wilson ................ H01M 10/482 |
| 2020/0388509 | A1* | 12/2020 | Nomura .................. H01L 21/56 |

FOREIGN PATENT DOCUMENTS

| | | | |
|---|---|---|---|
| JP | 2018-511932 | A | 4/2018 |
| JP | 6459019 | B2 | 1/2019 |
| JP | 2019-21757 | A | 2/2019 |
| JP | 6484019 | B2 | 3/2019 |
| JP | 2019-140262 | A | 8/2019 |
| JP | 2019-212493 | A | 12/2019 |
| JP | 6718106 | B2 | 7/2020 |
| KR | 10-2007-0071222 | A | 7/2007 |
| KR | 10-1346828 | B1 | 1/2014 |
| KR | 10-1641435 | B1 | 7/2016 |
| KR | 10-1772490 | B1 | 8/2017 |
| KR | 10-2017-0110418 | A | 10/2017 |
| KR | 10-2017-0142922 | A | 12/2017 |
| KR | 10-2019-0009987 | A | 1/2019 |
| KR | 10-2073850 | B1 | 2/2020 |
| WO | WO 2012/155036 | A2 | 11/2012 |
| WO | WO 2018/110458 | A1 | 7/2016 |

OTHER PUBLICATIONS

Extended European Search Report for European Application No. 21829514.5, dated Dec. 15, 2023.

* cited by examiner

120 : 121, 122, 123

120 : 121, 122, 123

120 : 121, 122, 123

CIRCUIT BOARD ASSEMBLY MANUFACTURING METHOD, CIRCUIT BOARD ASSEMBLY MANUFACTURED BY SAME, AND ELECTRIC VEHICLE INCLUDING SAME

CROSS REFERENCE TO RELATED APPLICATIONS

This application is the National Phase of PCT International Application No. PCT/KR2021/007515, filed on Jun. 15, 2021, which claims priority under 35 U.S.C. 119(a) to Patent Application No. 10-2020-0076507, filed in the Republic of Korea on Jun. 23, 2020 and Patent Application No. 10-2021-0046550, filed in the Republic of Korea on Apr. 9, 2021, all of which are hereby expressly incorporated by reference into the present application.

TECHNICAL FIELD

The present invention relates to a method for manufacturing a circuit board assembly, and more particularly, to a method for manufacturing a circuit board assembly, which is capable of protecting components mounted on a circuit board, and a circuit board assembly manufactured therethrough.

BACKGROUND ART

A secondary battery, which is chargeable and dischargeable, that is, a battery, is used as an energy source for mobile devices such as smartphones. In addition, the battery is being also used as energy sources for electric vehicles, hybrid electric vehicles, etc., which are suggested as measures for solving air pollution caused by gasoline and diesel vehicles using fossil fuels.

The battery is being also used as energy sources for e-mobilities, which are spotlighted these days as the demands for a healthy lifestyle increase. Such as an e-mobility is a collective term for personal transportation means for one or two people riding in an eco-friendly electric driving manner and includes various types of light electric vehicles such as electric bicycles, electric motorcycles, and miniature electric vehicles (three-wheeled vehicles) as well as upright transportation means such as electric kickboards.

Therefore, applications using batteries as well as electric vehicles (EVs) and light electric vehicles (LEVs) are being diversified due to advantages of the batteries, and in the future, it is expected that batteries will be applied to more fields and products than now.

An electric vehicle (hereinafter, collectively referred to as an electric vehicle) including the light electric vehicle using the battery as power has to be equipped with a battery management system (BMS) and the like to control an operation of the battery. In addition, a controller for controlling the electric vehicle such as driving and controlling of a motor has to be provided. Components such as the controller for driving the motor and a BMS for managing the battery are mounted on a circuit board. In this case, the controller and the BMS may be mounted on different substrates. That is, the components for driving and controlling the electric vehicle and the components for managing the battery may be mounted on different substrates. Such a circuit board may use a printed circuit board (PCB) on which a predetermined circuit pattern is printed.

The circuit board uses a conductive material such as copper to electrically connect the components mounted thereon to constitute a circuit, and the circuit patterns may be electrically connected to each other by moisture or heat because of a substantially narrow interval therebetween to damage the circuit. Also, the components mounted on the circuit board may be damaged by the moisture or heat or may be separated from the circuit board by an external impact.

Therefore, it is important to protect the circuit board and the components against the heat, the moisture or the external impact so that the components mounted on the circuit board perform their functions.

(Patent Document 1) Korean Patent Registration No. 10-1641435

DISCLOSURE OF THE INVENTION

Technical Problem

The present invention provides a method of manufacturing a circuit board assembly capable of protecting a circuit board and components mounted thereon.

The present invention provides a method of manufacturing a circuit board assembly capable of protecting a circuit board and components by forming a protective layer after mounting the components on the circuit board.

The present invention provides a method for manufacturing a circuit board assembly capable of protecting a circuit board and components, and a circuit board assembly manufactured by the method, and an electric vehicle provided with the circuit board assembly.

Technical Solution

A method for manufacturing a circuit board assembly according to one aspect (first embodiment) of the present invention includes: preparing a mold including a concave portion corresponding to a shape of each of a plurality of components and a convex portion corresponding to a surface of a circuit board; mounting the plurality of components on the circuit board; providing the mold at an upper side of the circuit board and preparing a protective material to be disposed on the circuit board; disposing the protective material on the circuit board and the components by using the mold; and curing the protective material to form a protective layer.

The preparing of the protective material to be disposed on the circuit board may include disposing the protective material between the circuit board and the mold, and the disposing of the protective material on the circuit board and the components by using the mold may include pressing the mold to allow the protective material to be in contact with the circuit board and the components.

The protective material may have a width greater than that of the circuit board and a thickness greater than an interval between the concave portion and each of the components.

Predetermined vibration may be applied to the protective material through the mold.

The concave portion may have a depth greater than a height of each of the components and a width greater than that of each of the components.

An interval between the concave portion and the convex portion may correspond to a thickness of the protective layer.

The protective material may include a hot melt resin, a photocurable resin, a thermosetting resin, a wet resin, or a combination thereof.

The protective layer may be formed to have the same thickness on an upper portion of the circuit board and side and top surfaces of each of the components.

At least one region of the protective layer may be formed to have a different thickness.

The protective layer may have a thickness of 5 μm to 1 mm.

A method for manufacturing a circuit board assembly according to another aspect (second embodiment) of the present invention includes: preparing a mold including a concave portion corresponding to a shape of each of a plurality of components and a convex portion corresponding to a surface of a circuit board; mounting the plurality of components on the circuit board; providing the mold at an upper side of the circuit board and preparing a protective material to be disposed on the circuit board; disposing the protective material on the circuit board and the components by using the mold; and curing the protective material to form a protective layer.

The preparing of the protective material to be disposed on the circuit board may include allowing a container, in which the protective material is stored in a melted form, to communicate with the mold, and the disposing of the protective material on the circuit board and the components by using the mold may include injecting the melted protective material through the mold to allow the circuit board and the components to be in contact with the melted protective material.

The mold may be controlled in a range of a predetermined temperature that is greater than room temperature and less than a melting temperature of the protective material.

The melted protective material may be injected through tubes, which is formed to pass through the convex portion, and air may be exhausted through tubes, which is formed to pass through the concave portion, among a plurality of tubes formed to pass through the concave portion and the convex portion of the mold.

The air may be exhausted through a filter provided in an opening of each of the tubes, which are formed to pass through the concave portion, to suppress or prevent leakage of the melted protective material.

The concave portion may have a depth greater than a height of each of the components and a width greater than that of each of the components.

An interval between the concave portion and the convex portion may correspond to a thickness of the protective layer.

The protective material may include a hot melt resin, a photocurable resin, a thermosetting resin, a wet resin, or a combination thereof.

The protective layer may be formed to have a same thickness on an upper portion of the circuit board and side and top surfaces of each of the components.

At least one region of the protective layer may be formed to have a different thickness than other regions of the protective layer.

The protective layer may have a thickness of 5 μm to 1 mm.

A circuit board assembly according to further another aspect of the present invention is manufactured according to the one aspect or another aspect of the present invention.

An electric vehicle according to further another aspect of the present invention includes a battery that provides electric energy, a BMS that manages the battery, a controller that controls a state of the electric vehicle, and a motor that drives the electric vehicle, wherein the BMS is a first component of a first circuit board assembly manufactured through the method for manufacturing the circuit board assembly according to the one aspect or another aspect of the present invention, and the controller is a second component of a second circuit board assembly manufactured through the method for manufacturing the circuit board assembly according to the one aspect or another aspect of the present invention.

Advantageous Effects

In the circuit board assembly manufactured according to the present invention, the plurality of components may be mounted on the circuit board, and the protective layer may be formed on the upper portion of the circuit board and on the side and top surfaces of the plurality of components. The protective layer may be formed using the mold having the uneven structure corresponding to the circuit board and the shapes of the plurality of components mounted on the circuit board. According to the present invention, since the protective layer is formed on the circuit board on which the components are mounted, the circuit board and the components may be protected against the heat, the moisture or the external impact. Therefore, the circuit board assembly may perform its functions without malfunction due to the heat, the moisture, or the external impact.

MODE FOR CARRYING OUT THE INVENTION

Figure 1:
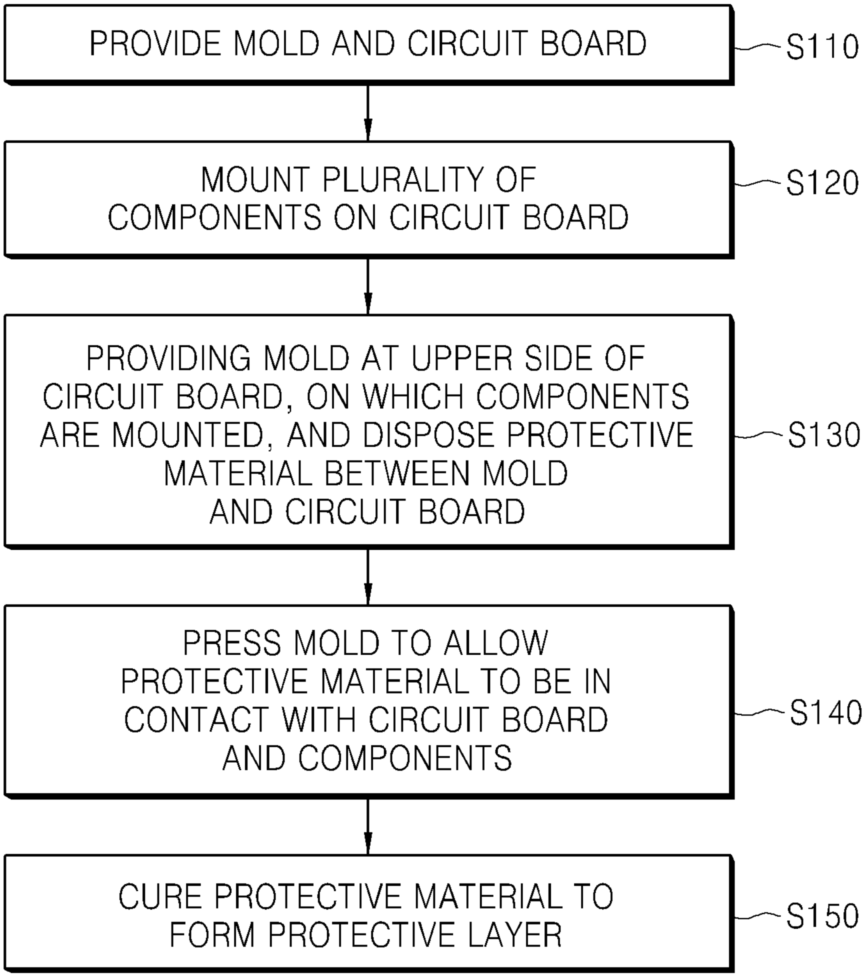
FIG. 1 is a process flowchart for explaining a method for manufacturing a circuit board assembly according to an embodiment (first embodiment) of the present invention.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In order to explain the embodiment of the present invention, the drawings may be exaggerated, parts irrelevant to the description may be omitted from the drawings, and the same reference numerals in the drawings refer to the same elements.

1. Method for Manufacturing Circuit Board Assembly According to Embodiments of the Present Invention A method for manufacturing a circuit board assembly according to embodiments of the present invention includes a process of preparing a mold including a concave portion corresponding to a shape of each of a plurality of components and a convex portion corresponding to a surface of a circuit board, a process of mounting the plurality of components on the circuit board, a process of providing the mold at an upper side of the circuit board and preparing a protective material to be disposed on the circuit board, a process of disposing the protective material on the circuit board and the components by using the mold, and a process of curing the protective material to form a protective layer.

Here, in an embodiment (first embodiment) of the present invention, the process of preparing the protective material to be disposed on the circuit board may include a process of disposing the protective material between the circuit board and the mold.

In addition, in an embodiment of the present invention, the process of disposing the protective material on the circuit board and the components by using the mold may include a process of pressing the mold to allow the protective material to be in contact with the circuit board and the components.

That is, in an embodiment of the present invention, the protective layer may be formed by a press process using the mold having an uneven structure corresponding to the circuit board and the shape of each of the plurality of components mounted on the circuit board.

In another embodiment (second embodiment) of the present invention, the process of preparing the protective material to be disposed on the circuit board may include a process of allowing a container, in which the melted protective material is stored, to communicate with the mold.

In addition, in another embodiment of the present invention, the process of disposing the protective material on the circuit board and the components by using the mold may include a process of injecting the melted protective material through the mold to allow the circuit board and the components to be in contact with the melted protective material.

That is, in another embodiment of the present invention, the protective layer may be formed by an insert-injection molding process using the mold having an uneven structure corresponding to the circuit board and the shape of each of the plurality of components mounted on the circuit board.

Hereinafter, embodiments of the present invention will be described in detail with reference to the drawings.

2. Method for Manufacturing Circuit Board Assembly According to an Embodiment (First Embodiment) of the Present Invention FIG. 1 is a process flowchart for explaining a method for manufacturing a circuit board assembly according to an embodiment (first embodiment) of the present invention, and FIGS. 2 to 6 are schematic cross-sectional views illustrating each process in the method for manufacturing the circuit board assembly according to an embodiment of the present invention.

Referring to FIG. 1, a method for manufacturing a circuit board according to an embodiment of the present invention may include a process (S110) of providing a mold and a circuit board, a process (S120) of mounting a predetermined component on the circuit board, a process (S130) of preparing the mold at an upper side of the circuit board, on which the component is mounted, a process (S140) of pressing the mold to allow a protective material to be in contact with the circuit board and the component, and a process (S150) of curing the protective material to form a protective layer. The method for manufacturing the circuit board according to an embodiment of the present invention will be described in detail for each process with reference to FIGS. 2 to 6 as follows.

S110: The process of providing the mold and the circuit board will be described as follows.

The process of providing the mold and the circuit board includes a process of preparing the mold and a process of preparing the printed circuit board.

Figure 4:
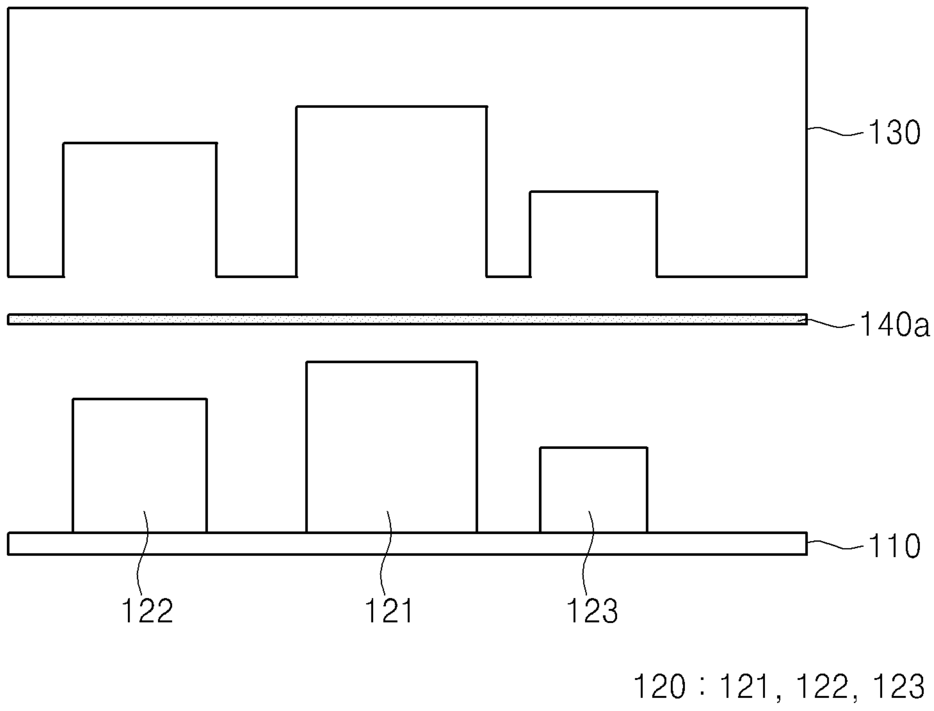

Referring to FIGS. 1 and 4, a mold 130 including a concave portion having a shape corresponding to that of each of a plurality of components 120 and a convex portion corresponding to a surface of a circuit board 110 is prepared.

The mold 130 may be provided in a predetermined thickness and have a concave (凹) portion in a shape of each of the components at a portion corresponding to each of the plurality of components 120 and a convex (凸) portion corresponding to a top surface of the circuit board 110. That is, the mold 130 may have an even structure that matches the components 120 mounted on the circuit board 110 and the top surface of the circuit board 110. In this case, the concave portion corresponding to the components 120 of the mold 130 may be formed to be larger than each of the components 130. That is, the concave portion may be formed to have a height greater than that of the component 120 and a width greater than that of the component 120. The width of the concave portion may be greater about 10 μm to about 2 mm than the width of the component 120, and the depth of the concave portion may be greater about 5 μm to about 1 mm than the height of the component 120. Thus, a side surface of the component 120 and an inner surface of the concave portion may be spaced an interval of about 5 μm to about 1 mm from each other, and a top surface of the component 120 and a bottom of the concave portion may also be spaced an interval of about 5 μm to about 1 mm from each other. In this case, the interval between the side surface of the component 120 and the inner surface of the concave portion may be the same as or different from the interval between the top surface of the component 120 and the bottom surface of the concave portion. If the intervals are different from each other, the interval between the side surface of the component and the inner surface of the concave portion may be greater than the interval between the top surface of the component 120 and the bottom surface of the concave portion. Alternatively, the interval between the side surface of the component 120 and the inner surface of the concave portion may be less than the interval between the top surface of the component 120 and the bottom surface of the concave portion.

Figure 2:
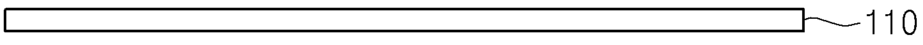
FIGS. 2 to 6 are schematic cross-sectional views illustrating each process in the method for manufacturing the circuit board assembly according to an embodiment of the present invention.

Referring to FIGS. 1 and 2, a printed circuit board (PCB) on which a circuit pattern is formed on an insulating layer is prepared. In the printed circuit board, the circuit pattern may be generally formed by attaching a thin copper plate to a surface such as a phenolic resin insulating layer or an epoxy resin insulating layer and then etching the thin copper plate according to a predetermined pattern so as to form a necessary circuit pattern. The printed circuit board may be used as the circuit board 110. The printed circuit board may use a single-sided board, a double-sided board, a multi-layered board, etc. depending on the number of circuit layers and insulating layers. Here, the number of layers may be selected according to the number of components and a degree of integration of components mounted on the printed circuit board because the higher the number of layers, the better the mounting force of electronic components so as to be used for high-precision products.

The plurality of circuit boards 110 may be used in an electric vehicle. That is, a first circuit board, on which a plurality of components including a controller for driving a motor and controlling an electric vehicle are mounted, and a second circuit board, on which a plurality of components including a BMS for managing a battery are mounted, may be used in the electric vehicle. In this case, sizes of the first circuit board and the second circuit board may be different from each other, and also, shapes of a circuit pattern, intervals between the circuit patterns, and the like may be different from each other. For example, the first circuit board may have a size greater than that of the second circuit board. The first and second circuit boards may be manufactured at various ratios depending on the type of electric vehicles or light electric vehicles to be applied, the number and density of components mounted on the board, and the like. The first circuit board and the second circuit board may have a ratio of 2:1 to 10:1 in width and 2:1 to 15:1 in length, for example, may have a ratio of 2:1 in width and a ratio of 5:1 in length. That is, a horizontal length of the first circuit board is greater 2 times to 5 times than the horizontal length of the second circuit board, and a vertical length of the first circuit board is greater 2 times to 10 times than the vertical length of the second circuit board. Also, the first circuit board and the second circuit board may have an area ratio of 4:1 to 50:1, for example, an area ratio of 10:1. That is, the area of the first circuit board is greater 4 times to 50 times than the area of the second circuit board.

Figure 3:
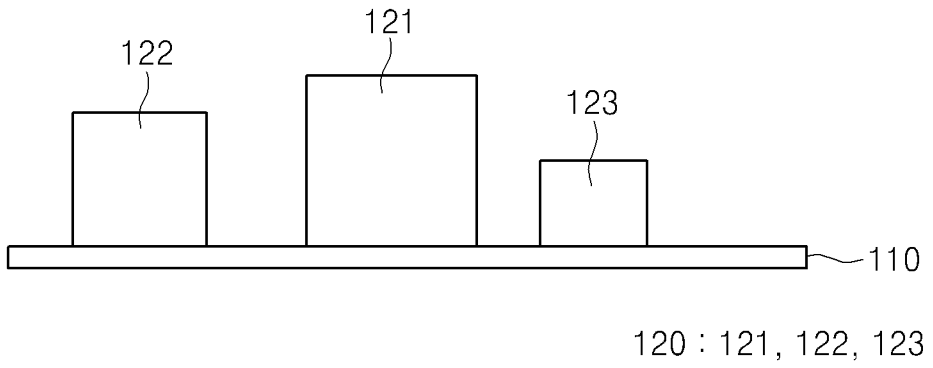

S120: Referring to FIGS. 1 and 3, at least one component 120 for driving and controlling the electric vehicle is mounted on the circuit board 110. In this case, the component 120 mounted on the circuit board 110 may be in various forms such as a chip or an individual element. For example, passive elements such as a capacitor, an inductor, and a resistor in addition to a controller may be mounted on the first circuit board. In this way, the main board may be manufactured by mounting the controller and passive elements on the first circuit board. In addition, at least one component for managing the battery may be mounted on the second circuit board. For example, passive elements such as a capacitor, an inductor, and a resistor in addition to a battery management system (BMS) may be mounted on the second circuit board. In this way, a sub-board may be manufactured by mounting the BMS and the passive elements on the second circuit board.

FIG. 3 illustrates a cross-sectional view in which a plurality of components 120 are mounted on any one circuit board 110. The circuit board 110 may be the first circuit board on which the controller is mounted, or the second circuit board on which the BMS is mounted. In an embodiment of the present invention, the second circuit on which the BMS is mounted will be described as an example. As illustrated in FIG. 3, the circuit board 110 may have a uniform thickness, and the plurality of components 120 mounted on the circuit board 110 may have different heights and/or widths. For example, a height of a first component 121 may be greater than that of each of the second and third components 122 and 123, and a height of the second component 122 may be greater than that of the third component 123. In addition, a width of the first component 121 may be greater than that of each of the second and third components 122 and 123, and a width of the second component 122 may be greater than that of the third component 123. In addition, at least one interval between the plurality of components may be different. For example, an interval between the first component 121 and the second component 122 may be greater than that between the first component 121 and the third component 123. The plurality of components may have a circular shape or a rectangular shape when viewed from above. That is, some components among the plurality of components may have a cylindrical shape and a hexagonal column shape. The shapes of the plurality of components are merely an example for understanding the invention, and thus, various shapes are possible.

S130: Referring to FIGS. 1 and 4, the circuit board 110 on which the plurality of components 120 are mounted is seated and fixed on a predetermined seating base (not shown). A mold 130 having an uneven structure according to the shape of the component 120 mounted on the circuit board 110 may be provided at an upper side of a worktable. In addition, a protective material 140*a* is disposed between the mold 130 and the circuit board 110.

The protective material 140*a* may be provided in the form of gel between the mold 130 and the circuit board 110. Alternatively, the protective material 140*a* may be provided in the form of a film having a predetermined thickness according to its properties. In this case, the protective material 140*a* may use a hot melt resin. However, the protective material 140*a* may use a photocurable resin, a thermosetting resin, a wet resin, or a combination thereof in addition to the hot melt resin.

A width of the protective material 140*a* in a horizontal direction may be greater than the width of the circuit board 110. In addition, a thickness of the protective material 140*a* in a vertical direction may be greater than the interval between the concave portion and the component. Thus, when the protective material 140*a* is pressed onto the circuit board 110, the protective material 140*a* may completely cover the entire top surface of the circuit board 110.

Figure 5:
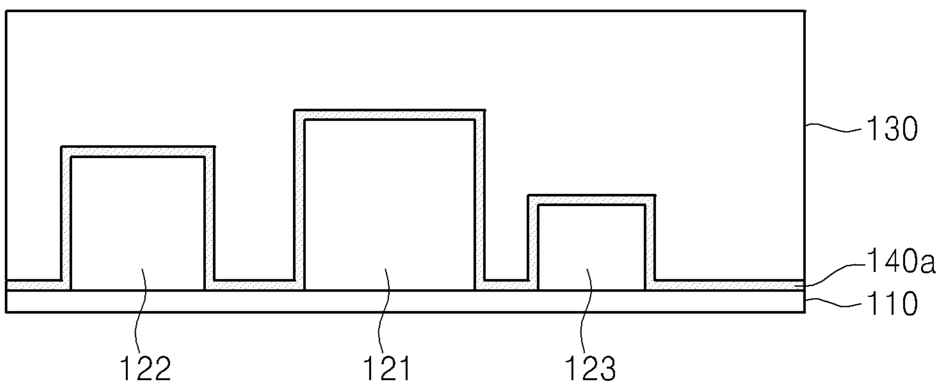

S140: Referring to FIGS. 1 and 5, the mold 130 moves downward to press the circuit board 110 with the protective material 140*a* interposed therebetween so that the protective material 140*a* is in contact with the circuit board 110 and the component 120. In this case, heat may be applied to the protective material 140*a* to allow the protective material 140*a* to flow through the mold 130. For example, heat may be applied in a range so that the protective material 140*a* has fluidity and does not cause thermal damage to the circuit board 110, for example, heat may be applied at a temperature of 140° C. In this way, the protective material 140*a* is disposed between the mold 130 and the circuit board 110 and between the mold 130 and the component 120 by pressing the mold 130 while the protective material 140*a* flows by applying heat.

In addition, predetermined vibration may be applied to the protection material 140*a* through the mold 130 to allow the protection material 104 to flow. That is, the mold 130 may vibrate to allow the protective material 140*a* to flow, thereby improving flowability of the protective material 140*a*. In this case, a direction in which the mold 130 vibrates may be any one of the vertical direction and the horizontal direction, and a distance in which the mold 130 vibrates may be less than the thickness of the protective material 140*a*. Accordingly, while preventing the component 120 on the circuit board 110 from being damaged by the vibration, the protective material 140*a* may vibrates to improve the flowability.

Figure 6:
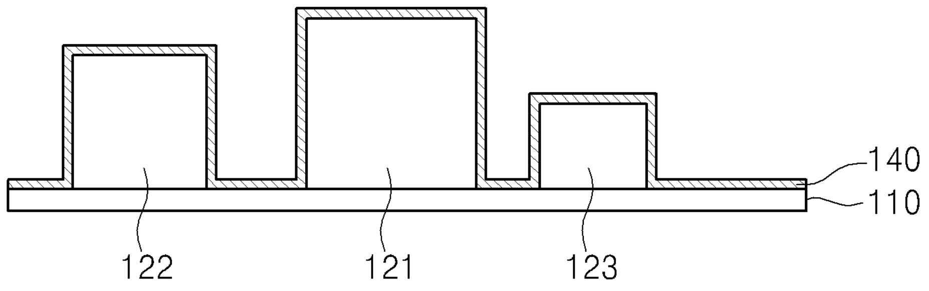

S150: Referring to FIGS. 1 and 6, after pressing the mold 130 for a predetermined time, the mold 130 moves upward to separate the mold 130. Thus, the protective material 140*a* remains on the upper portion of the circuit board 110 and the side and top surfaces of the component 120. The protective material 140*a* is cured to form a protective layer 140. In order to form the protective layer 140, a predetermined curing process may be performed depending on the protective material. In the case of the hot melt resin, the hot melt resin may be applied in a high-temperature state and then cured while being cooled. In addition, in the case of the photocurable adhesive resin, the photocurable adhesive resin may be cured using ultraviolet rays (UV), in the case of the thermosetting resin, the thermosetting resin may be cured by heating the applied adhesive resin, and in the case of the wet resin, the wet resin may be cured in response to moisture contained in air.

The protective layer 140 may be formed on the circuit board 110 and the component 120 mounted on the circuit board 110 by the above-described process. That is, the protective layer 140 may be formed on the side and top surfaces of the component 120 and on the circuit board 110 that is exposed because the component 120 is not mounted. In this case, the protective layer 140 may be formed to a thickness corresponding to the interval between the circuit board 110, the component 120, and the mold 130. That is, the protective layer 140 may be formed to a thickness of 5 μm to 1 mm. In this case, the protective layer 140 may have the same thickness on the side surface and the top surface of the component 120 and the top surface of the circuit board 110, and any one may be different. That is, the protective layer 150 may be formed to have the same thickness on the top surface of the circuit board 110, the side surfaces and the top surface of the component 120. That is, the protective layer 140 may be formed to have the same thickness along a stepped portion and thus may have uniform step coverage. Alternatively, the protective layer 140 may be formed to have the same thickness on the top surface of the component 120 and the top surface of the circuit board 110 and may be formed to have different thicknesses on the side surfaces of the component 120. For example, the thickness of the top surface of the component 120 and the top surface of the circuit board 120 may be greater than that of the side surface of the component. Alternatively, conversely, the thickness of the top surface of the component 120 and the top surface of the circuit board 110 may be less than that of the side thickness of the component. In addition, any one region of the protective layer 140 may be formed to have a thickness different from that of the other regions.

As described above, in the circuit board assembly manufactured according to an embodiment of the present invention, the plurality of components 120 may be mounted on the circuit board 110, and the protective layer 140 may be formed on the upper portion of the circuit board 110 and the side and top surfaces of the plurality of components 120. The protective layer 140 may be formed through a press process by the mold 130 having the uneven structure corresponding to the shapes of the circuit board 110 and the plurality of components 120 mounted on the circuit board 100. The protective layer 140 may be formed to have a uniform thickness on the side and top surfaces of the circuit board 110 and the component 120, and at least one region may be formed to have a different thickness from the other regions. According to the present invention, the protective layer 140 may be formed on the circuit board 110, on which the component 120 is mounted, to protect the circuit board 110 and the component 120 against heat, moisture, or an external impact. Therefore, the circuit board assembly may perform its functions without malfunction due to the heat, the moisture, or the external impact.

The method for manufacturing the circuit board assembly according to an embodiment of the present invention has been described in detail above with reference to FIGS. 1 to 6. However, the method for manufacturing the circuit board assembly according to an embodiment of the present invention may be variously modified according to another embodiments (second embodiment) below.

Figure 7:
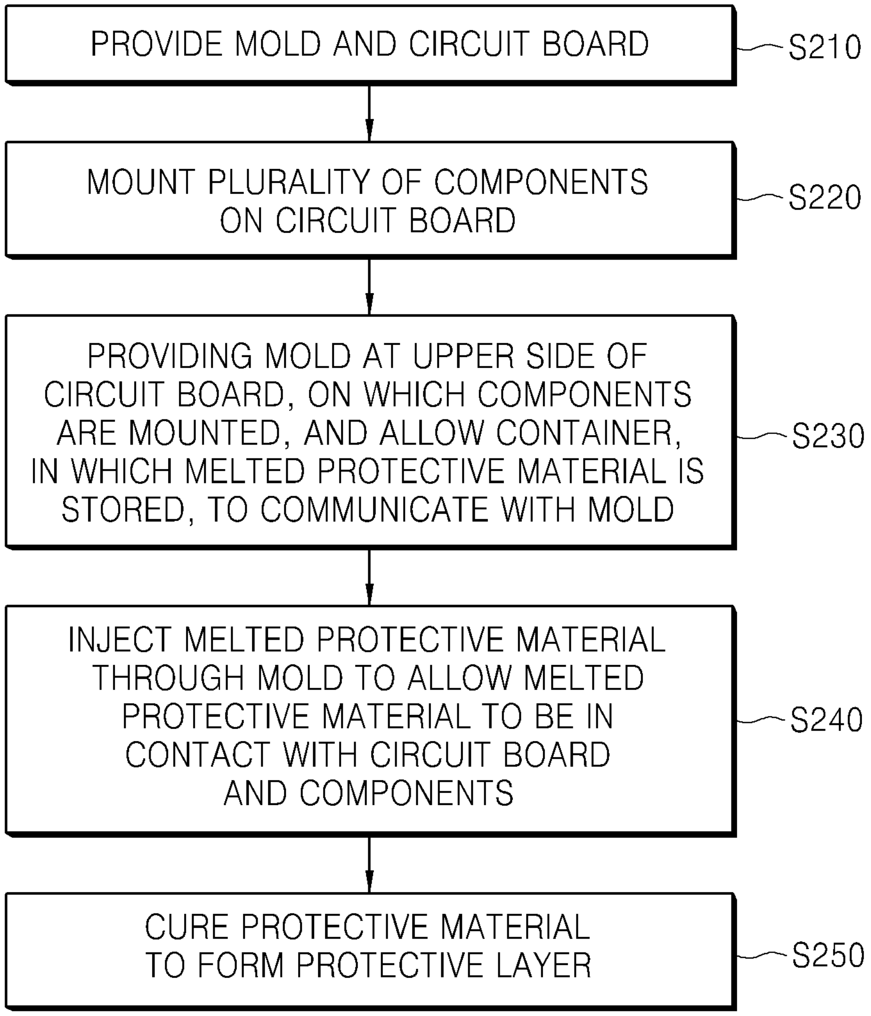
FIG. 7 is a process flowchart for explaining a method for manufacturing a circuit board assembly according to another embodiment (second embodiment) of the present invention.
Figure 8:
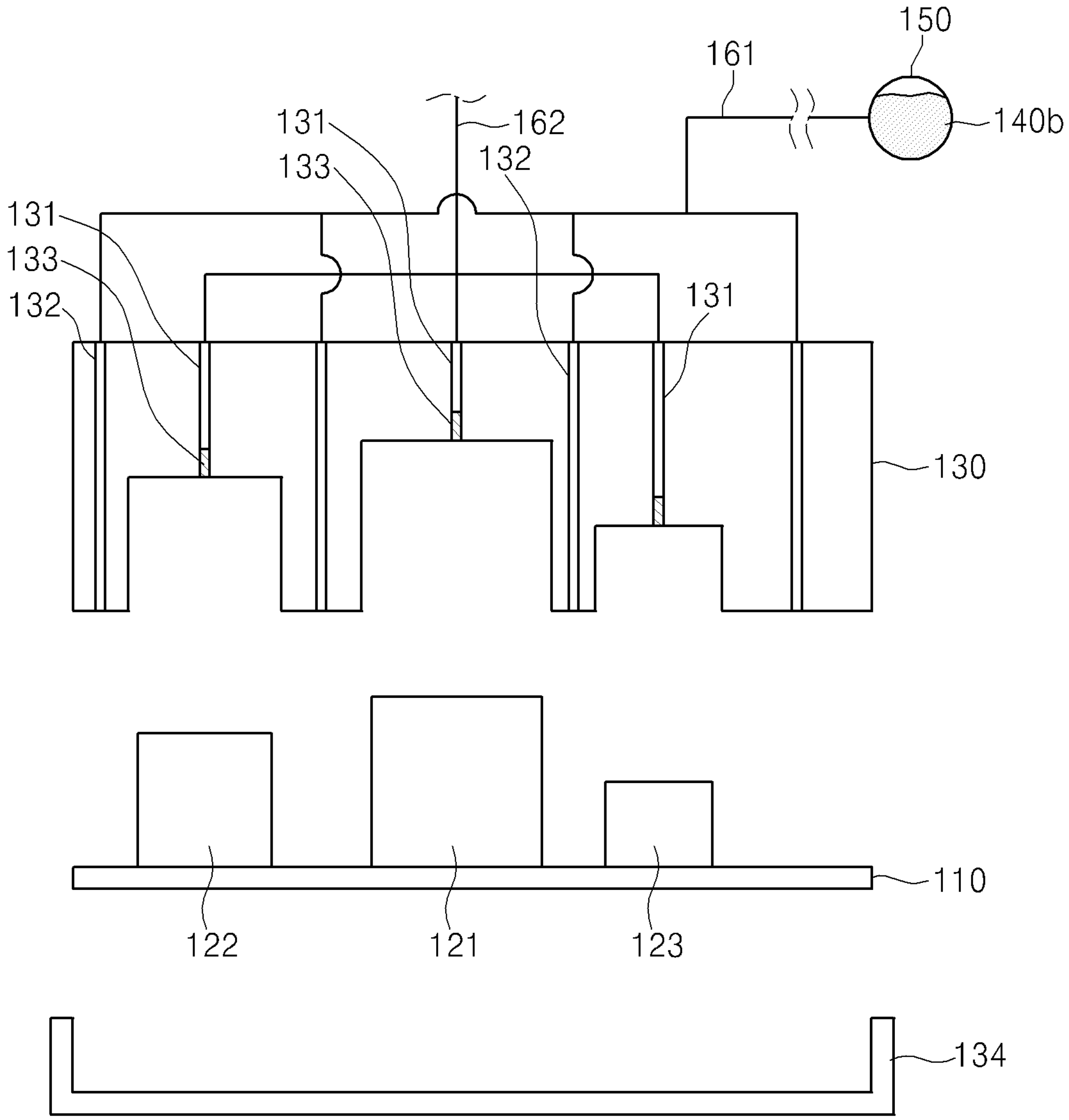
FIGS. 8 to 9 are schematic cross-sectional views illustrating each process in the method for manufacturing the circuit board assembly according to another embodiment of the present invention.
Figure 9:
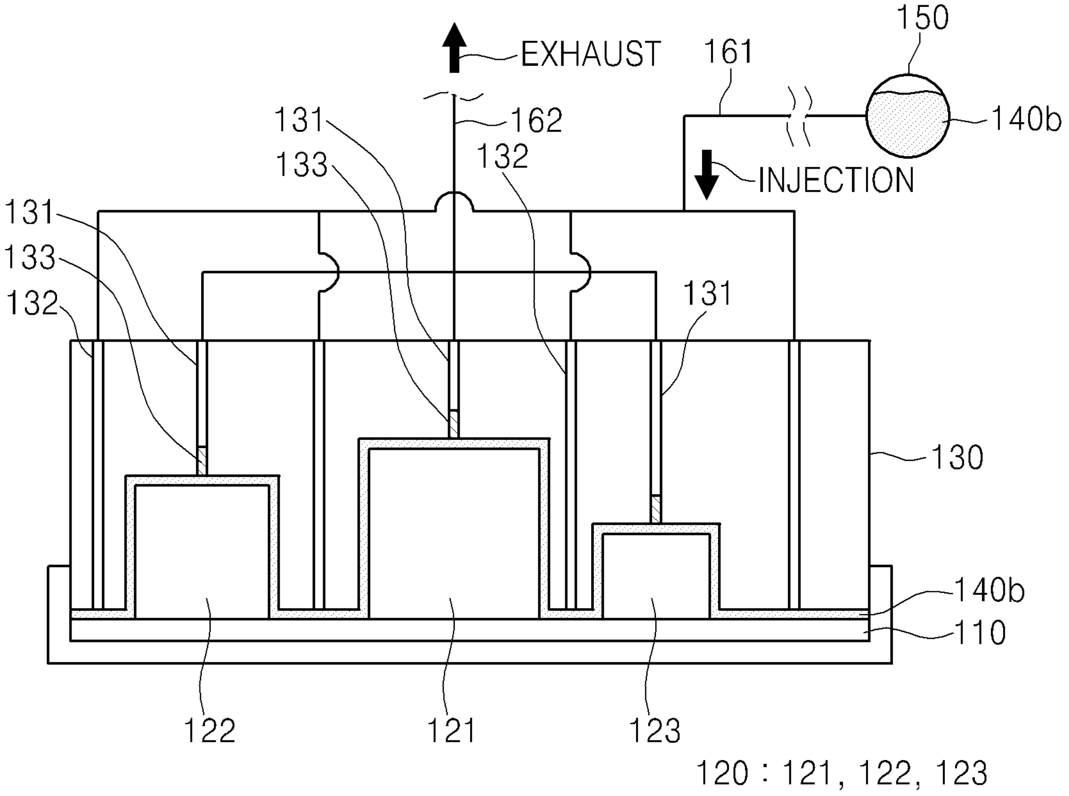

3. Method For Manufacturing Circuit Board Assembly According to Another Embodiment (Second Embodiment) of the Present Invention FIG. 7 is a process flowchart for explaining a method for manufacturing a circuit board assembly according to another embodiment (second embodiment) of the present invention. FIGS. 8 to 9 are schematic cross-sectional views illustrating each process in the method for manufacturing the circuit board assembly according to another embodiment of the present invention.

Referring to FIG. 7, a method for manufacturing a circuit board according to another embodiment of the present invention may include a process (S210) of providing a mold and a circuit board, a process (S220) of mounting a predetermined component on the circuit board, a process (S230) of preparing the mold at an upper side of the circuit board, on which the component is mounted, to allow a container, in which a melted protective material is stored, to communicate with the mold, a process (S240) of injecting the melted protective material through the mold to allow the circuit board and the component to be in contact with the melted protective material, and a process (S250) of curing the protective material to form a protective layer. The method for manufacturing the circuit board according to another embodiment of the present invention will be described in detail for each process with reference to FIGS. 8 to 9 as follows.

At this time, another embodiment of the present invention will be described with a focus on differences between the method for manufacturing the circuit board assembly according to an embodiment of the present invention and the method for manufacturing the circuit board assembly according to another embodiment of the present invention.

S210: The process of providing the mold and the circuit board will be described as follows.

The process of providing the mold and the circuit board includes a process of preparing the mold and a process of preparing the printed circuit board.

A mold 130 including a concave portion having a shape corresponding to that of each of a plurality of components 120 and a convex portion corresponding to a surface of a circuit board 110 is prepared.

The mold 130 may be provided in a predetermined thickness and have a concave (凹) portion in a shape of each of the components at a portion corresponding to each of the plurality of components 120 and a convex (凸) portion corresponding to a top surface of the circuit board 110. That is, the mold 130 may have an even structure that matches the components 120 mounted on the circuit board 110 and the top surface of the circuit board 110. In this case, the concave portion corresponding to the components 120 of the mold 130 may be formed to be larger than each of the components 130. In addition, the interval between the side surface of the component 120 and the inner surface of the concave portion may be the same as or different from the interval between the top surface of the component 120 and the bottom surface of the concave portion.

A plurality of tubes 131 and 132 may be provided in the mold 130. The plurality of tubes 131 and 132 may be formed to extend in a vertical direction so as to pass through the concave and convex portions of the mold 130. In this case, a filter 133 may be provided in a lower opening of the tube 131 connected to the concave portion among the plurality of tubes 131 and 132. The filter 133 may discharge air and be formed in a predetermined shape and made of a material capable of suppressing or blocking the transfer of the melted protective material 140*b*.

The process of preparing the mold 130 may further include a process of preparing a lower mold 134. The lower mold 134 serves to close a gap between edges of the mold 130 and the circuit board 110 through insert injection molding. The lower mold 134 may be referred to as a lower mold for the insert injection molding.

A printed circuit board (PCB) having the circuit pattern formed thereon is prepared on an insulating layer.

The plurality of circuit boards 110 may be used in an electric vehicle. That is, a first circuit board, on which a plurality of components including a controller for driving a motor and controlling an electric vehicle are mounted, and a second circuit board, on which a plurality of components including a BMS for managing a battery are mounted, may be used in the electric vehicle. In this case, sizes of the first circuit board and the second circuit board may be different from each other, and also, shapes of a circuit pattern, intervals between the circuit patterns, and the like may be different from each other.

S220: At least one component 120 for driving and controlling the electric vehicle is mounted on the circuit board 110. In this case, the component 120 mounted on the circuit board 110 may be in various forms such as a chip or an individual element.

S230: The circuit board 110 on which the plurality of components 120 are mounted is seated and fixed to a predetermined lower mold 134. A mold 130 having an uneven structure according to the shape of the component 120 mounted on the circuit board 110 may be provided at an upper side of the lower mold 134. In this case, the container 150 in which the melted protective material 140*b* is stored may communicate with the mold 130. That is, an injection tube 161 may be connected to the plurality of tubes 132 connected to the convex portion of the mold 130, and the container 150 in which the melted protective material 140*b* is stored may be connected to the injection tube 161. In this case, an exhaust tube 162 may be connected to the plurality of tubes 131 connected to the concave portion of the mold 130.

The melted protective material 140*b* may be provided inside the container 150. The protective material 140*a* may use a hot melt resin. However, the protective material 140*a* may use a photocurable resin, a thermosetting resin, a wet resin, or a combination thereof in addition to the hot melt resin. The melted protective material 140*b* may be controlled at a temperature of 200° C. to 300° C.

S240: The melted protective material 140*b* is injected through the mold 130 to allow the circuit board 110 and the component 120 to be in contact with the melted protective material 140*b*. That is, the melted protective material 140*b* is injected into the plurality of tubes 132 connected to the convex portion of the mold 130 from the container 150 through the injection tube 161, and then, the circuit board 110 and the component 120 is in contact with the melted protective material 140*b*. In addition, air may be exhausted through the tubes 131 formed to pass through the concave portion. In this case, it is possible to prevent the melted protective material 140*b* from leaking into the exhaust tube 162 by the filter 133 provided in the opening of each of the tubes 131 formed to pass through the concave portion.

An injection pressure of the melted protective material 140*b* may be a pressure of 20 bar, and an injection flow rate may be a flow rate of 1.1 cc/sec to 2.7 cc/sec. As a result, it is possible to prevent the component 120 from being damaged by the injection pressure of the melted protective material 140*b*.

The mold 130 and the lower mold 134 may be controlled in a range of a predetermined temperature greater than room temperature and less than a melting temperature of the melted protective material 140*b*. Specifically, the mold 130 and the lower mold 134 may be controlled at a temperature of 30° C. to 50° C. Thus, the melted protective material 140*b* may be controlled at a predetermined temperature so as to have fluidity between the mold 130 and the circuit board 110 and so as not to thermally damage the circuit board 110 For example, the melted protective material 140*b* may be controlled to be cooled at a predetermined temperature around 140° C. between the mold 130 and the circuit board 110.

S250: After performing the insert injection molding for a predetermined time, the mold 130 moves upward to separate the mold 130. Thus, the protective material 140*a* remains on the upper portion of the circuit board 110 and the side and top surfaces of the component 120. The protective material 140*a* is cured to form a protective layer 140. In order to form the protective layer 140, a predetermined curing process may be performed depending on the protective material. In the case of the hot melt resin, the hot melt resin may be applied in a high-temperature state and then cured while being cooled. In addition, in the case of the photocurable adhesive resin, the photocurable adhesive resin may be cured using ultraviolet rays (UV), in the case of the thermosetting resin, the thermosetting resin may be cured by heating the applied adhesive resin, and in the case of the wet resin, the wet resin may be cured in response to moisture contained in air.

The protective layer 140 may be formed on the circuit board 110 and the component 120 mounted on the circuit board 110 by the above-described process. That is, the protective layer 140 may be formed on the side and top surfaces of the component 120 and on the circuit board 110 that is exposed because the component 120 is not mounted. In this case, the protective layer 140 may be formed to a thickness corresponding to the interval between the circuit board 110, the component 120, and the mold 130. That is, the protective layer 140 may be formed to a thickness of 5 μm to 1 mm. In this case, the protective layer 140 may have the same thickness on the side surface and the top surface of the component 120 and the top surface of the circuit board 110, and any one may be different. That is, the protective layer 150 may be formed to have the same thickness on the top surface of the circuit board 110, the side surfaces and the top surface of the component 120. That is, the protective layer 140 may be formed to have the same thickness along a stepped portion and thus may have uniform step coverage. Alternatively, the protective layer 140 may be formed to have the same thickness on the top surface of the component 120 and the top surface of the circuit board 110 and may be formed to have different thicknesses on the side surfaces of the component 120. For example, the thickness of the top surface of the component 120 and the top surface of the circuit board 120 may be greater than that of the side surface of the component. Alternatively, conversely, the thickness of the top surface of the component 120 and the top surface of the circuit board 110 may be less than that of the side thickness of the component. In addition, any one region of the protective layer 140 may be formed to have a thickness different from that of the other regions.

As described above, in the circuit board assembly manufactured according to another embodiment of the present invention, the plurality of components 120 may be mounted on the circuit board 110, and the protective layer 140 may be formed on the upper portion of the circuit board 110 and the side and top surfaces of the plurality of components 120. The protective layer 140 may be formed through an insert injection molding process by the mold 130 having the uneven structure corresponding to the shapes of the circuit board 110 and the plurality of components 120 mounted on the circuit board 100. The protective layer 140 may be formed to have a uniform thickness on the side and top surfaces of the circuit board 110 and the component 120, and at least one region may be formed to have a different thickness from the other regions.

4. Circuit Board Assembly Manufactured by Method for Manufacturing Circuit Board Assembly According to Embodiments of the Present Invention and Electric Vehicle Having the Same The circuit board assembly manufactured as described above may be used as a main board, on which a controller for driving and controlling an electric vehicle is mounted, and a sub-board, on which a BMS for managing a battery is mounted. The main board and the sub-board may be mounted on in the electric vehicles including light electric vehicles. An example of the electric vehicle equipped with the main board and the sub-board, which is manufactured according to the present invention, is illustrated in FIG. 10.

Figure 10:
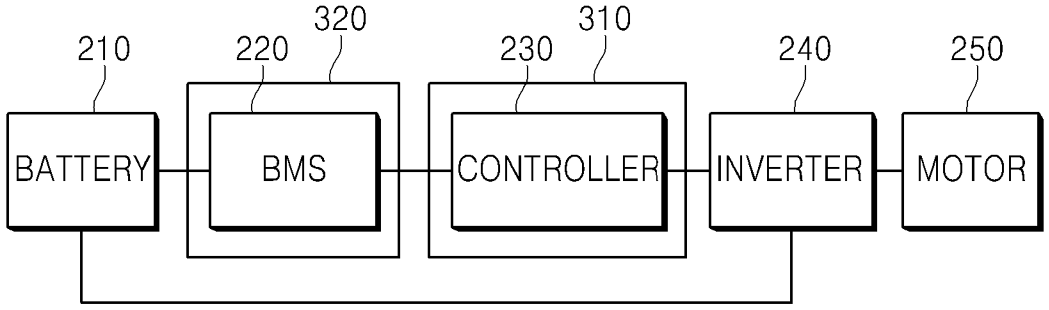
FIG. 10 is a block diagram for explaining an electric vehicle, on which the circuit board assembly manufactured by the method for manufacturing the circuit board assembly according to the embodiments of the present invention is mounted.

FIG. 10 is a block diagram for explaining an electric vehicle, on which the circuit board assembly manufactured by the method for manufacturing the circuit board assembly according to the embodiments of the present invention is mounted on the main board 310 and the sub-bard 320.

Referring to FIG. 10, an electric vehicle according to the present invention may include a battery 210 that provides electric energy, a BMS 220 that manages the battery 210, a controller 230 that controls a state of the electric vehicle, an inverter 240 that converts power of the battery 210, and a motor 250 that drives the electric vehicle. Here, the BMS 220 constitutes a sub-board 320 as a second circuit board assembly of the present invention, and the controller 230 constitutes a main board 310 as a first circuit board assembly of the present invention.

The battery 210 is an electric energy source that provides driving force to the motor 250 to drive the electric vehicle. The battery 210 may be managed by the BMS 220 and charged by an external power source. Here, the battery 210 may include at least one battery pack. The at least one battery pack may include a plurality of battery modules, and the battery module may include a plurality of chargeable and dischargeable battery cells. The plurality of battery modules may be connected in series and/or parallel in various ways to meet specifications of the vehicle or the battery pack, and the plurality of battery cells may also be connected in series and/or parallel. Here, the type of battery cells is not particularly limited and may include, for example, a lithium ion battery, a lithium polymer battery, a nickel cadmium battery, a nickel hydrogen battery, a nickel zinc battery, and the like.

The BMS 220 estimates the state of the battery 210 and manages the battery 210 by using the estimated state information. For example, the BMS 220 estimates state information of the battery 210 such as a state of charge (SOC) of the battery, a state of health (SOH) of the battery, maximum input/output power tolerances, and an output voltage of the battery 210. Then, the charging or discharging of the battery 210 is controlled using the state information. The BMS 220 according to the present invention includes an SOC estimation device for estimating the SOC of the battery. In addition, the BMS 220 controls cell balancing for balancing the SOC of each battery cell. That is, the battery cell having a relatively high SOC may be discharged, and the battery cell having a relatively low SOC may be charged. In order to manage the battery 210 using the BMS 220, a sensing unit for sensing the state of the battery 210 may be further included. The sensing unit may include a current sensor that senses current of the battery 210, a voltage sensor that senses a voltage, and a temperature sensor that senses a temperature. At this time, each of the current sensor, the voltage sensor, and the temperature sensor may be provided in at least one. The BMS 220 is mounted on a circuit board, and a protective layer is formed to constitute a sub-board. That is, a plurality of components for estimating the SOC, a plurality of components for cell balancing, a plurality of components constituting the sensing unit, and other passive elements are mounted on the circuit board, and the protective layer is formed to constitute the sub-board 320. Although not shown, a charging/discharging protection circuit for protecting the battery 210 by controlling the charging/discharging of the battery 210 may be further provided. That is, the charging/discharging protection circuit may be mounted on the sub-board as a separate component from the BMS 220.

The controller 230 is an electronic control device that controls the state of the electric vehicle. For example, a degree of torque is determined based on information such as an accelerator, a break, and a speed, and an output of the motor 250 is controlled to match the torque information. Also, an ECU 230 enables the battery 210 to be charged or discharged based on state information such as the SOC and the SOH of the battery 210, which are transmitted from the BMS 220. For example, if the SOC transmitted from the BMS 220 is 55% or less, the charging/discharging switch is controlled to output power to the battery 210, thereby charging the battery 210, and if the SOC is 55% or more, the charging/discharging switch is controlled to output power to the motor 250, thereby discharging the battery 210. The controller 230 is mounted on the circuit board, and the protective layer is formed to constitute the main board 310. In addition to the controller 230, a communication component for transmitting and receiving a signal into/from the components constituting the electric vehicle and a communication component for transmitting and receiving a signal into/from the BMS 220 may be mounted on the circuit board, and the protective layer may be formed to constitute the main board 310.

The inverter 240 drives the motor 250 to enable the electric vehicle to run based on the control signal of the controller 230.

The motor 250 drives the electric vehicle based on the control information (e.g., torque information) transmitted from the controller 230 using electric energy of the battery 210.

Although the deposition apparatus and method have been described with reference to the specific embodiments, they are not limited thereto. It should be noted that the configurations and methods disclosed in the above embodiments of the present invention may be combined and modified in various forms by combining or exchanging the configurations and methods with each other, and the modifications thereof may also be considered as the scope of the present invention. Therefore, it will be readily understood by those skilled in the art that various modifications and changes can be made thereto without departing from the spirit and scope of the present invention defined by the appended claims.

DESCRIPTION OF THE SYMBOLS

110: Circuit board
120: Component
130: Mold
134: Lower mold
140*a*: Protective material
140*b*: Melted protective material
140: Protective layer
150: Container

The invention claimed is:

1. A method for manufacturing a circuit board assembly, the method comprising:

preparing a mold comprising a concave portion corresponding to a shape of each of a plurality of components and a convex portion corresponding to a surface of a circuit board, the convex portion of the mold being located between the plurality of components;

mounting the plurality of components on the circuit board;

providing the mold at an upper side of the circuit board and preparing a protective material to be disposed on the circuit board;

disposing the protective material on the circuit board and the plurality of components by using the mold; and curing the protective material to form a protective layer.

2. The method of claim 1, wherein the preparing of the protective material to be disposed on the circuit board comprises disposing the protective material between the circuit board and the mold, and the disposing of the protective material on the circuit board and the plurality of components by using the mold comprises pressing the mold to allow the protective material to be in contact with the circuit board and the plurality of components.

3. The method of claim 2, wherein the protective material has a width greater than that of the circuit board and a thickness greater than an interval between the concave portion and each of the plurality of components.

4. The method of claim 3, wherein predetermined vibration is applied to the protective material through the mold.

5. The method of claim 1, wherein the preparing of the protective material to be disposed on the circuit board comprises allowing a container, in which the protective material is stored in a melted form, to communicate with the mold, and the disposing of the protective material on the circuit board and the plurality of components by using the mold comprises injecting the melted protective material through the mold to allow the circuit board and the plurality of components to be in contact with the melted protective material.

6. The method of claim 5, wherein the mold is controlled in a range of a predetermined temperature that is greater than room temperature and less than a melting temperature of the protective material.

7. The method of claim 6, wherein the melted protective material is injected through tubes, which are formed to pass through the convex portion, and air is exhausted through tubes, which are formed to pass through the concave portion, among a plurality of tubes formed to pass through the concave portion and the convex portion of the mold.

8. The method of claim 7, wherein the air is exhausted through a filter provided in an opening of each of the tubes, which are formed to pass through the concave portion, to suppress or prevent leakage of the melted protective material.

9. The method of claim 1, wherein the concave portion has a depth greater than a height of each of the components and a width greater than that of each of the components.

10. The method of claim 9, wherein an interval between the concave portion and the convex portion corresponds to a thickness of the protective layer.

11. The method of claim 1, wherein the protective material comprises a hot melt resin, a photocurable resin, a thermosetting resin, a wet resin, or a combination thereof.

12. The method of claim 1, wherein the protective layer is formed to have a same thickness on an upper portion of the circuit board and side and top surfaces of each of the components.

13. The method of claim 1, wherein at least one region of the protective layer is formed to have a different thickness than other regions of the protective layer.

14. The method of claim 1, wherein the protective layer has a thickness of 5 micrometers (μm) to 1 millimeter (mm).

15. A circuit board assembly manufactured through the method of claim 1.

16. An electric vehicle comprising a battery that provides electric energy, a battery management system (BMS) that manages the battery, a controller that controls a state of the electric vehicle, and a motor that drives the electric vehicle, wherein the BMS is a first component of a first circuit board assembly, wherein the controller is a second component of a second circuit board assembly, and wherein the first circuit board assembly and the second circuit board assembly are manufactured by the method of claim 1.

17. The method of claim 1, wherein an interval between a side surface of a component of the plurality of components and a side surface of the concave portion is less than an interval between a top surface of the component of the plurality of components and a bottom surface of the concave portion.

* * * * *